United States Patent

Hirota et al.

[11] Patent Number: 5,944,891
[45] Date of Patent: Aug. 31, 1999

[54] METHOD FOR THE HEAT TREATMENT OF ZNSE CRYSTAL

[75] Inventors: Ryu Hirota; Shinsuke Fujiwara, both of Osaka, Japan

[73] Assignee: Sumitomo Electric Industries, Ltd., Osaka, Japan

[21] Appl. No.: 08/907,650

[22] Filed: Aug. 11, 1997

[30] Foreign Application Priority Data

Aug. 12, 1996 [JP] Japan .................................. 8-212329

[51] Int. Cl.$^6$ ........................................................ C30B 1/00
[52] U.S. Cl. ........................... 117/204; 117/100; 117/956
[58] Field of Search ............................... 117/956, 3, 100, 117/204

[56] References Cited

U.S. PATENT DOCUMENTS

| 4,584,053 | 4/1986 | Namba | 156/603 |
|---|---|---|---|
| 4,960,721 | 10/1990 | Terashima | 437/247 |
| 5,204,283 | 4/1993 | Kitagawa | 437/105 |

FOREIGN PATENT DOCUMENTS 0 316 161  5/1989  European Pat. Off. .

OTHER PUBLICATIONS

"Growth of cubic ZnS, ZnSe and $ZnS_xSe_{1-x}$ single crystal by iodine transport". Journal of crystal growth 47 (1979) p. 326–334.

Koyama et al., "etch pit studies of ZnSe crystal grown by the iodine transport method" Journal of Crystal Growth, vol. 96, No. 1, May 1989, Amsterdam NL, pp. 217–220, XP000008667.

Korostelin et al., "vapour growth and characterisation of bulk ZnSe single crystals" Journal of Crystal Growth, vol. 161, Apr. 1, 1996, Amsterdam NL, pp. 51–59, XP000626732.

Boettcher et al., "Zinc Selenide single crystal growth by chemical transport reactions" Journal of Crystal Growth, vol. 146, No. 1/4, Jan. 1, 1995, pp. 53–58, XP000511842.

Newbury et al., "the effect of annealing treatment on the microstructure or layers of zinc selenide deposited onto 100 germanium surfaces" Thin Solid Films., vol. 22, No. 3, Jul. 1974, Lausanne Ch, pp. 323–330, XP002046979.

*Primary Examiner*—R. Bruce Breneman
*Assistant Examiner*—Alan Olsen
*Attorney, Agent, or Firm*—Pillsbury Madison & Sutro LLP

[57] ABSTRACT

An object of the present invention is to provide a method for the heat treatment of a ZnSe crystal whereby the crystal can be prevented from crystallinity deterioration and caused to have low resistivity without occurrence of precipitates in the crystal.

The feature of the present invention consists in a method for the heat treatment of ZnSe comprising subjecting ZnSe crystal grown by a chemical vapor transport method using iodine as a transport agent to a heat treatment in a Zn vapor atmosphere and controlling a cooling rate after the heat treatment in 10 to 200° C./min.

5 Claims, 1 Drawing Sheet

METHOD FOR THE HEAT TREATMENT OF ZNSE CRYSTAL

BACKGROUND OF THE INVENTION

1. Field of the Invention

This invention relates to a method for decreasing the resistivity of a ZnSe crystal grown by a chemical vapor transport (CVT) method using iodine as a transport agent, comprising subjecting the ZnSe crystal to a heat treatment in a Zn vapor atmosphere.

2. Description of the Prior Art

ZnSe crystal has a high resistivity even if containing iodine to be n-type dopant due to self-compensation by Zn vacancies unless the ZnSe crystal is subjected to a heat treatment after the growth. Thus, this crystal can be caused to have low resistivity by activating iodine through a heat treatment in Zn vapor at a high temperature. In this method, however, if a cooling rate after the heat treatment is small, a vapor pressure of Zn applied is decreased due to lowering of the temperature and Zn holoes are again increased to increase the resistivity. Thus, a rapid cooling method has generally been employed after the heat treatment.

For example, it has been reported in "J. of Electronic Materials", Vol. 8, No. 5 (1979), p 619–633 that ZnSe crystal grown by a chemical vapor transport method using iodine as a transport agent and Zn are arranged in two quartz ampoules, one of which is heat treated at 800° C. for 13 hours and another of which is heat treated at 830° C. for 24 hours, and both of them are then charged in an oil at 25° C. and rapidly cooled to obtain ZnSe crystals each having a specific resistivity of 0.12 $\Omega$ cm and 0.08 $\Omega$ cm.

When the ZnSe crystal after the heat treatment is rapidly cooled in an oil, however, crystallinity thereof is deteriorated, for example, dislocations are increased and ordinarily, cracks occur in the crystal. This is probably due to fact that the temperature of the crystal is rapidly lowered, the temperature gradient in the crystal is increased and thermal stress is generated to deteriorate the crystallinity.

The inventors have found that when the ZnSe crystal after the heat treatment is gradually cooled at a cooling rate of 1° C./min, cracks can be prevented, but precipitates often occur in the crystal so that the ZnSe crystal having predetermined crystallinity cannot be obtained.

SUMMARY OF THE INVENTION

It is an object of the present invention to provide a method for the heat treatment of a ZnSe crystal whereby the above described disadvantages can be overcome and the crystal can be prevented from deterioration of crystallinity and caused to have low resistivity without occurrence of precipitates in the crystal.

It is another object of the present invention to provide a method of decreasing the resistivity of a ZnSe crystal grown by a chemical vapor transport method using iodine as a transport agent, comprising subjecting the ZnSe crystal to a heat treatment in a Zn vapor atmosphere.

These objects can be attained by a method for the heat treatment of ZnSe comprising subjecting a ZnSe crystal grown by a chemical vapor transport method using iodine as a transport agent to a heat treatment in a Zn vapor atmosphere and controlling a cooling rate after the heat treatment in 10 to 200° C./min.

BRIEF DESCRIPTION OF THE DRAWING

The accompanying drawing illustrates the principle and merits of the present invention in detail.

DETAILED DESCRIPTION OF THE INVENTION

Figure 1:
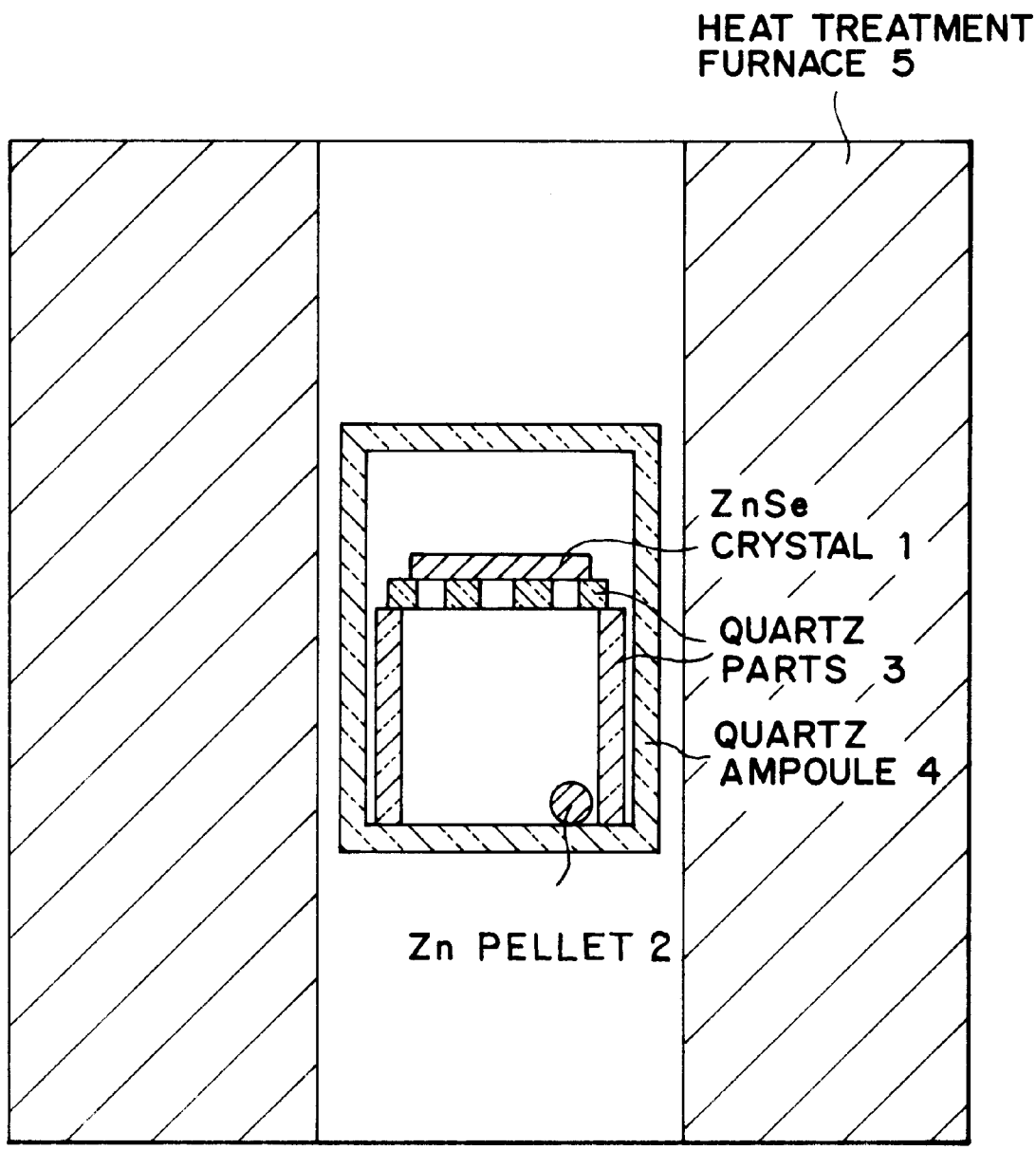
FIG. 1 is a schematic view of an apparatus for the practice of a method for the heat treatment according to the present invention.

The inventors have made various efforts to develop a method for decreasing the resistivity of a ZnSe crystal grown by a chemical vapor transport method using iodine as a transport agent, and consequently, have found that a heat treatment of the ZnSe crystal and a controlled cooling rate after the heat treatment are effective for this purpose. The present invention is based on this finding.

Accordingly, the present invention provides a method for the heat treatment of ZnSe comprising subjecting a ZnSe crystal grown by a chemical vapor transport method using iodine as a transport agent to a heat treatment in a Zn vapor atmosphere and controlling a cooling rate after the heat treatment in 10 to 200° C./min.

According to the method of the present invention, a ZnSe crystal grown by a chemical vapor transport method using iodine as a transport agent, that is, a ZnSe crystal having a high resistivity because of self-compensation by Zn vacancies is subjected to a heat treatment in Zn vapor, thereby causing this crystal to have low resistivity without deterioration of crystallinity thereof. It is required to control the cooling rate after the heat treatment within the range of 10 to 200° C./min. If the cooling rate is less than 10° C./min, the specific resistivity cannot sufficiently be decreased and precipitates occur in the crystal, while if more than 200° C./min, cracks occur in the crystal and dislocation density is increased to deteriorate the crystallinity. This is not favorable.

In the heat treatment of the present invention, ZnSe crystal as an object of the heat treatment is preferably heated at 800 to 1100° C. and a Zn pellet is heated at 750 to 1100° C., in such a manner that a temperature gradient between them be controlled within the range of 0 to 50° C., for a period of time of 50 to 200 hours.

FIG. 1 is a schematic view of an apparatus for carrying out a method for the heat treatment according to the present invention, in which a ZnSe crystal 1 grown by a chemical vapor transport method using iodine as a transport agent (hereinafter referred to as CVT crystal) is supported by quartz parts 3 in a quartz ampoule 4 and Zn pellet 2 is charged in the bottom of the quartz ampoule 4, followed by closing the quartz ampoule 4 and charging in a heat treatment furnace 5 maintained at predetermined heat treatment conditions.

The present invention will be illustrated by the following Examples in detail without limiting the same.

EXAMPLES

A CVT crystal was cut in seven samples each having a size of 5×5×1 mm$^3$, each sample 1 was supported by a quartz part 3 and arranged with etched Zn pellet 2 in seven quartz ampoules 4, as shown in FIG. 1. The quartz ampoule 4 was evacuated in a pressure of 3×10$^{-7}$ Torr and sealed. This quartz ampoule was charged in a heat treatment furnace 5, the crystal part was heated at 1000° C. and the bottom part having the Zn pellet arranged was heated at 980° C., the assembly being thus maintained and heat treated for 100 hours.

Six of the seven quartz ampoules were maintained in the heat treatment furnace and cooled to room temperature in such a manner that the cooling rates at the crystal parts were respectively adjusted to 1° C./min, 10° C./min, 20° C./min, 100° C./min, 200° C./min and 300° C./min. The other quartz ampoule was taken out of the heat treatment furnace and subjected to rapid cooling by charging in a sufficient amount of water at room temperature.

The resulting ZnSe crystals were taken out of the quartz ampoules and were subjected to investigation of specific resistivity, presence or absence of precipitates in the crystals and increase of dislocation densities as compared with before the heat treatment.

The specific resistivity was measured by the Hall measurements, the precipitate in the crystal was observed by means of Normarski microscope and the dislocation density was investigated by measurement of an etch pit density when etching with a bromine-methanol solution.

In the ZnSe crystal obtained at a cooling rate of 1° C./min, there were found linear precipitates with a high density in the whole crystal and no significant increase of the dislocation density. The specific resistivity was in a range of 0.07 to 0.08 Ω cm.

In the ZnSe crystals obtained at cooling rates of 10 to 200° C./min, there were found no precipitates in all the samples, nor significant increase of the dislocation densities. The specific resistivity could be lowered to a range of 0.04 to 0.05 Ω cm.

The ZnSe crystal obtained at a cooling rates of 300° C./min was in the form of finely broken pieces and had a number of cracks and increased dislocation density. The specific resistivity could not be measured because of finely broken pieces of the crystal.

When the quartz ampoule was taken out of the heat treatment furnace and subjected to rapid cooling by charging it in water, the quartz ampoule was ed and the crystal was also pulverized to give a size of about 1×1×1 mm$^3$. In the crystal, there were found no precipitates, but found a number of cracks and an increased dislocation density of from $10^4$ cm$^{-2}$ to at least $10^6$ cm$^{-2}$. The specific resistivity could not be measured because of finely en pieces of the crystal.

Advantages of the Invention

According to the present invention, a low resistivity ZnSe crystal can obtained without occurrence of precipitates and deterioration of the crystallinity by employing the above described constructions.

What is claimed is:

1. A method for heat treating a ZnSe crystal, comprising the steps of:
   (a) placing a ZnSe crystal in an ampoule having a top and a bottom;
   (b) first charging Zn in the bottom of the ampoule;
   (c) evacuating air from the ampoule;
   (d) sealing the ampoule;
   (e) second charging the ampoule in a heat treatment furnace by applying a first temperature to the top of the ampoule and a second temperature to the bottom of the ampoule, the first temperature being higher than the second temperature; and
   (f) controlling the cooling rate of the ZnSe crystal, after the heat treatment in a range of 10° C./min to 200° C./min, whereby the occurrence of precipitates is suppressed.

2. A method according to claim 1, wherein the second charging is carried out by heating the top of the ampoule at a temperature of 800 to 1100° C. and the bottom of the ampoule at a temperature of 750 to 1100° C.

3. A method according to claim 1, wherein the temperature difference between the top and the bottom of the ampoule is in the range of 0 to 50° C.

4. A method according to claim 1, wherein the ampoule is a quartz ampoule.

5. A method according to claim 2, wherein the second charging is carried out for 50 to 200 hours.

* * * * *